United States Patent [19]

Asaoka et al.

[11] Patent Number: 5,091,764
[45] Date of Patent: Feb. 25, 1992

[54] SEMICONDUCTOR DEVICE HAVING A TRANSPARENT ELECTRODE AND AMORPHOUS SEMICONDUCTOR LAYERS

[75] Inventors: Keizo Asaoka; Kazunori Tsuge; Yoshihisa Tawada, all of Kobe, Japan

[73] Assignee: Kanegafuchi Kagaku Kogyo Kabushiki Kaisha, Osaka, Japan

[21] Appl. No.: 143,797

[22] Filed: Sep. 28, 1989

[30] Foreign Application Priority Data

Sep. 30, 1988 [JP] Japan ................ 63-248452
Sep. 30, 1988 [JP] Japan ................ 63-248453
Sep. 30, 1988 [JP] Japan ................ 63-248454

[51] Int. Cl.$^5$ ........................................ H01L 27/14
[52] U.S. Cl. ........................................ 357/30; 357/2; 357/67; 136/256; 136/258
[58] Field of Search ............... 357/30 J, 30 K, 67, 357/30 P, 2, 30 Q; 136/258, 256

[56] References Cited

U.S. PATENT DOCUMENTS

| | | | |
|---|---|---|---|
| 4,378,460 | 3/1983 | Williams | 357/30 Q |
| 4,500,743 | 2/1985 | Hayashi et al. | 136/258 |
| 4,559,552 | 12/1985 | Yamazaki | 357/58 |
| 4,591,892 | 5/1986 | Yamazaki | 357/30 K |
| 4,694,116 | 9/1987 | Hayashi et al. | 357/67 X |
| 4,703,337 | 10/1987 | Yamazaki | 357/30 K |
| 4,788,582 | 11/1988 | Yamamoto | 357/58 X |
| 4,900,370 | 2/1990 | Itoga et al. | 357/30 J X |

FOREIGN PATENT DOCUMENTS

| | | |
|---|---|---|
| 221523 | 5/1987 | European Pat. Off. |
| 234222 | 9/1987 | European Pat. Off. |
| 62-73782 | 4/1987 | Japan |
| 62-73783 | 4/1987 | Japan |

OTHER PUBLICATIONS

Thin Solid Films, vol. 88, No. 2, Feb. 1982, pp. 93-100, "Dopant Effects in Sprayed Tin Oxide Films", E. Shanthi et al.
European Search Report, EP 89 11 7934.

*Primary Examiner*—Rolf Hille
*Assistant Examiner*—Roy Potter
*Attorney, Agent, or Firm*—Armstrong, Nikaido, Marmelstein, Kubovcik & Murray

[57] ABSTRACT

A semiconductor device having a transparent electrode comprising $SnO_2$, at least one semiconductor layer and a back electrode on a glass substrate wherein the dopant density of the transparent electrode is not more than 0.5 weight %, so that light absorption in the transparent electrode is lowered.

7 Claims, 5 Drawing Sheets

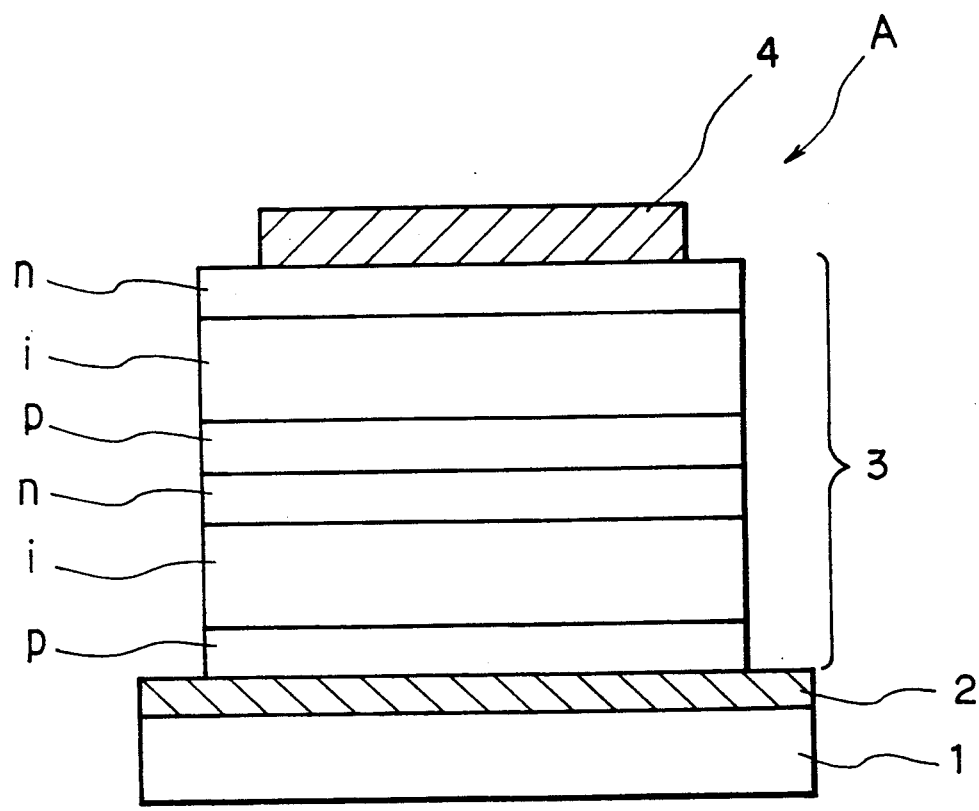

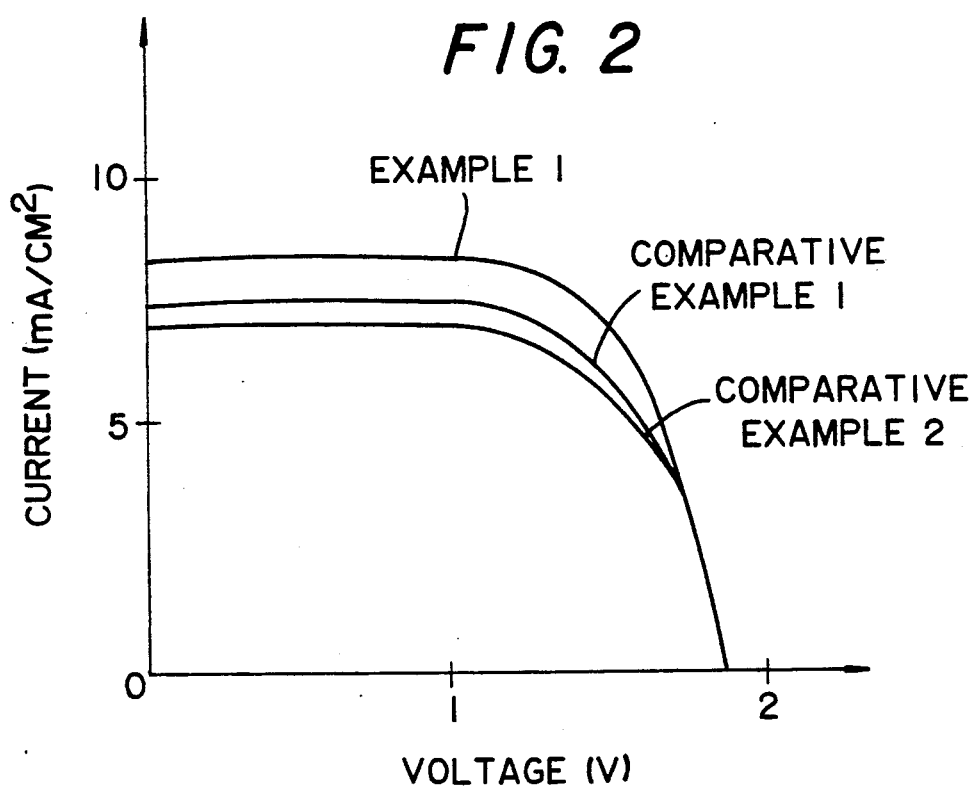
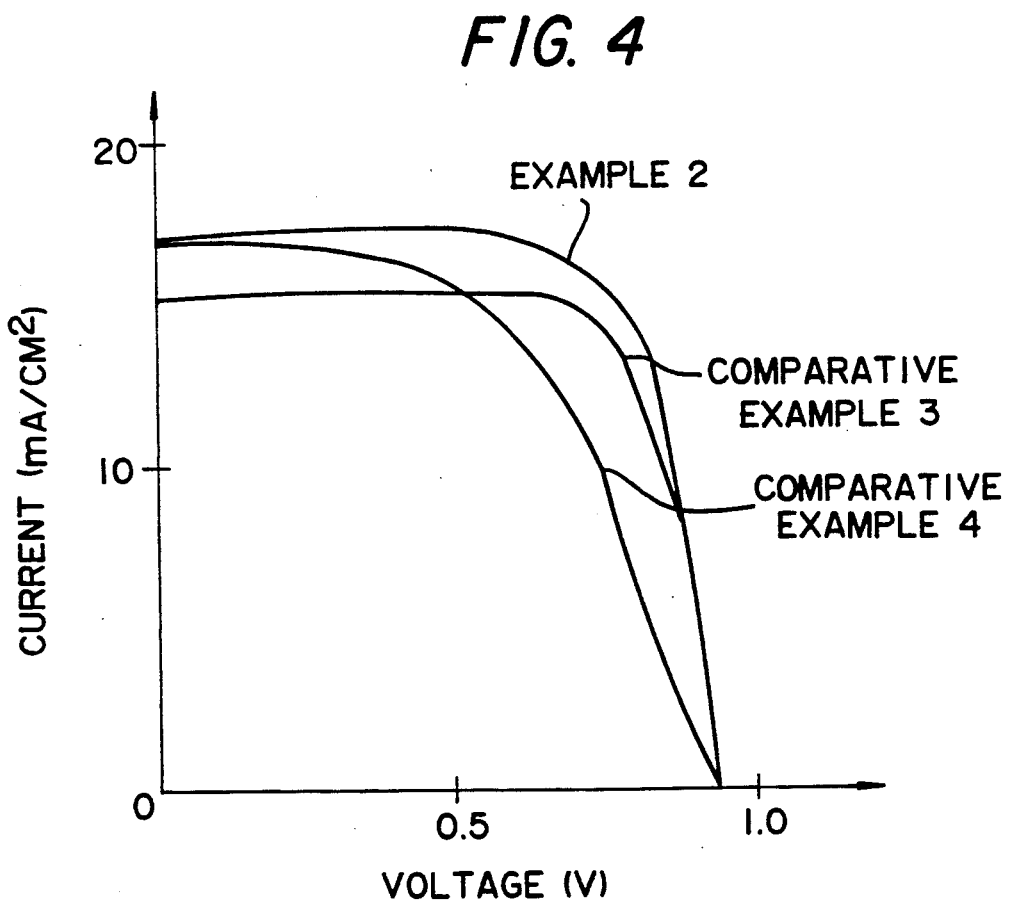

SEMICONDUCTOR DEVICE HAVING A TRANSPARENT ELECTRODE AND AMORPHOUS SEMICONDUCTOR LAYERS

BACKGROUND OF THE INVENTION

The present invention relates to a semiconductor device, and more particularly to a semiconductor having improved characteristics.

It is known that glass substrate of a solar cells having textured surfaces improve the light absorption characteristics of the solar cell by scattering the light. It is also known that if the thickness of an SnO₂ film is increased which is used as the transparent conductive film (transparent electrode) then the dimension of the reliefs between peaks and troughs thereof increases.

Photoelectric conversion efficiency (hereinafter referred to as FF), however, is greatly reduced when the relief between peaks and troughs of glass substrates is too large since the ratio of the internal series resistance of a solar cell becomes small. The relief dimension of a glass substrate is usually represented by the Haze ratio which is defined by the following formula:

$$\text{Haze ratio} = \frac{\text{Scatterd light}}{\text{Transmitted light}} \times 100 \, [\%].$$

When the thickness of SnO₂ film itself is increased light absorption of SnO₂ becomes large and the enhancement of the light absorption due to the textured surface is negated, so that efficiency of the solar cell is reduced. As a result, the transparent conductive film of a conventional solar cell usually has a thickness of between 5000 Å and 7000 Å and dopant density is between 1 and 2 weight %.

The light absorption coefficient of the transparent conductive film can be lowered by reducing the content of dopant, and the properties of the solar cell are improved without increasing light absorption of the transparent electrode even if a thick transparent conductive film is used in the solar cell.

However, the FF of a solar cell having low dopant transparent conductive film is not improved because increased contact resistance between the transparent electrode and the first layer of the amorphous semiconductor layers occurs. The first layer of the amorphous semiconductor layer is for example, p-type layer an i-type and an n-type semiconductor layer formed on the transparent electrode. The output current of multi-junction solar cell having a number of amorphous semiconductor layers are stacked to obtain high output current. Output current is defined by 1/number of blocks and output loss is defined by (1/number of blocks)². So that a transparent electrode having higher resistance can be employed. The resistivity of transparent electrode is normally controlled by thickness thereof, i.e., the resistivity increases in accordance with a decrease in thickness.

As a result, it is understandable that thinner transparent electrodes are employed for multi-junction solar cells as compared with single-junction solar cells. It is expected that output power will increase if thinner transparent electrode, are employed since light absorption by transparent electrodes is decreased.

However, the output power of a solar cell employing a thinner transparent electrode is not increased as is expected, because, as is mentioned above, the light scattering effect of the textured surface of transparent electrode is reduced in accordance with reduction in the transparent electrode thickness.

Taking the above mentioned matters into consideration, it is an object of the present invention to provide a semiconductor device of in which light absorption of transparent electrodes is improved.

Further, it is an object of the present invention to provide a semiconductor device wherein the contact resistance between the transparent electrode and the amorphous semiconductor layers is lowered.

Still further, it is an object of the present invention to provide a multi-junction solar cell in which output power is enhanced.

SUMMARY OF THE INVENTION

A semiconductor device of the present invention comprises:
(a) a transparent electrode comprising SnO₂;
(b) at least one semiconductor layer having a pin-junction or a nip-junction;
(c) a back electrode;
wherein the transparent electrode, the semiconductor layers and the back electrode are formed on a glass substrate in this order; and a dopant density of the transparent electrode is not more than 0.5 weight %.

It is preferable that an amorphous semiconductor, in which conductivity is equal to and dopant density is higher than those of the layer of semiconductor layers facing the transparent electrode, is sandwiched between the transparent electrode and the semiconductor layers when single a semiconductor layer is formed on the transparent electrode.

In the semiconductor device of the present invention, dopant density of transparent electrode is limited to not more than 0.5 weight %, so that light absorption by transparent electrode can be lowered.

Since resistivity can be increased by lowering dopant quantity, it is not necessary for a multi-junction solar cell to employ thin film of transparent electrode. As a result, lowering of light scattering effect of transparent conductive film can be avoided.

According to a preferred embodiment of the present invention wherein high dopant density semiconductor layer is sandwiched between the transparent electrode and the semiconductor layers, contact resistance thereof is decreased resulting in enhancing efficiency of single-junction solar cell.

BRIEF DESCRIPTION OF THE DRAWINGS

FIGS. 1, 3 and 5 are schematic illustrations of the first, the second and the third aspects of the present invention respectively;

FIG. 2 is a V-I characteristic diagram of example 1 and comparative examples 1 to 2;

FIG. 4 is a V-I characteristic diagram of example 2 and comparative examples 3 to 4.

DETAILED DESCRIPTION

Figure 3:
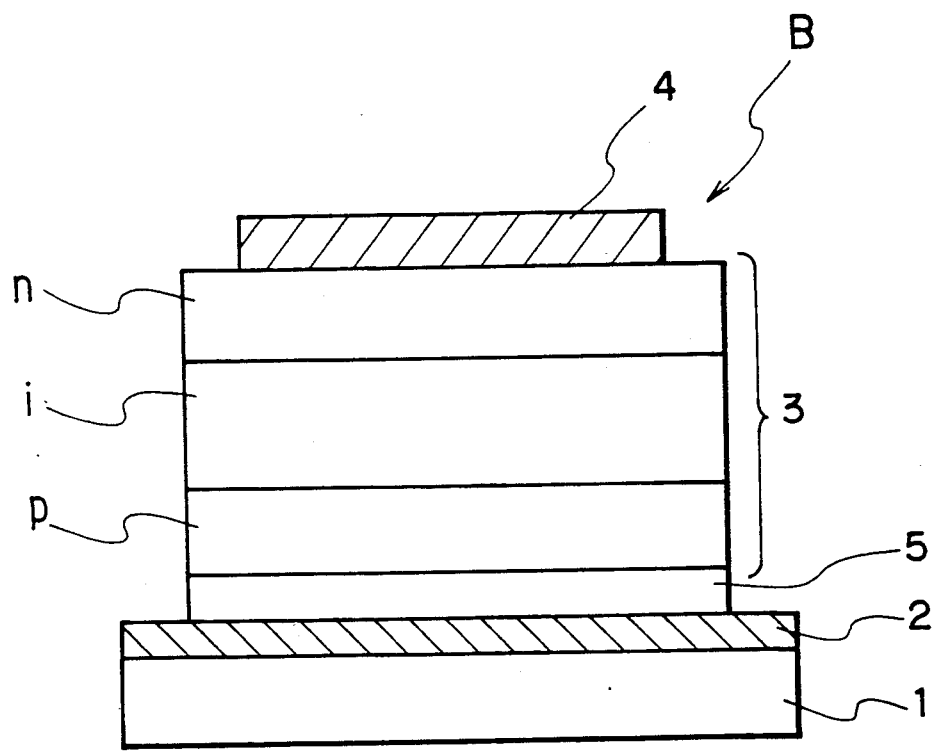

Referring now to the drawings for more complete understanding of the present invention, there is disclosed a semiconductor device.

FIG. 1 is a schematic illustration of the first embodiment of the present invention. In FIG. 1, A shows a semiconductor device of the first embodiment. The semiconductor device A comprises a glass substrate 1, a transparent electrode 2 comprising SnO$_2$, semiconductor layers 3 and a back electrode 4.

The transparent electrode 2 comprising SnO$_2$ is formed on the glass substrate 1 by the CVD method or the like. The thickness of the transparent electrode 2 is between 5000 Å and 20000 Å, preferably 5000 Å and 15000 Å. Dopant density of the electrode film is not more than 0.5 weight %. Al, Sb and F can be adopted as dopants. Sheet resistance of the transparent electrode 2 depends on the dopant content and the thickness thereof, however, it is preferably not more than 40 Ω/□ in order to avoid decreasing efficiency. When the sheet resistance is less than 10 Ω/□, the absorbed loss by added dopant cannot be neglected. As a result, it is preferably between 10 Ω/□ and 40 Ω/□.

On the transparent electrode 2, a number of semiconductor layers 3, comprising pin-type or nip-type amorphous semiconductor layers stacked by ordinary methods such as glow discharge decomposition method, are formed. FIG. 1 shows a model where in two pin-type amorphous semiconductor layers are formed, however, there is no limit to the number of semiconductor layers.

In the present invention, an amorphous semiconductor represents a semiconductor comprising only an amorphous semiconductor and a semiconductor comprising an amorphous semiconductor containing crystallite substrate. a-SiH; a-SiH containing C, Ge, Sn or F; or μC-SiH(microcrystalline) and the like are enumerated as concrete examples of an amorphous semiconductor.

On the semiconductor layers 3, the back electrode 4 comprising Al, Ag, Mo, Cr, Ni and so on is formed.

Now, Example 1 with respect to the first embodiment and comparative Examples 1 to 2 corresponding thereto are presented below.

EXAMPLE 1

On a glass substrate with 1.1 mm thickness, a transparent electrode having a thickness of 10000 Å comprising SnO$_2$ (no fluorine added) was formed by the CVD method.

By plasma CVD method, p-type semiconductor layer of 150 Å thickness with feeding SiH$_4$: 10 SCCM, CH$_4$: 20 SCCM and B$_2$H$_6$: 100 SCCM; i-type semiconductor layer of 700 Å thickness with feeding SiH$_4$: 150 SCCM; n-type semiconductor layer of 200 Å thickness with feeding SiH$_4$: 10 SCCM and PH$_3$: 200 SCCM; p-type semiconductor layer of 150 Å thickness with feeding SiH$_4$: 10 SCCM, CH$_4$: 20 SCCM and B$_2$H$_6$: 100 SCCM; i-type layer of 4000 Å thickness with feeding SiH$_4$: 100 SCCM; and n-type semiconductor layer of 300 Å thickness with feeding SiH$_4$: 10 SCCM and PH$_3$: 200 SCCM were stacked on the transparent electrode in this order.

A back electrode comprising Al of 1 μm thickness on the semiconductor layers were formed by vacuum evaporation method. V-I characteristic of the obtained semiconductor device was measured under AM-1 solar-simulator of 100 mW/cm$^2$ light intensity. The result is shown in FIG. 2.

COMPARATIVE EXAMPLE 1

A semiconductor device was made in the same manner as Example 1 except that the thickness of transparent electrode was 5000 Å and that fluorine of 2 weight % was added to the transparent electrode. V-I characteristic was measured in the same manner as in Example 1. The result is shown in FIG. 2.

COMPARATIVE EXAMPLE 2

A semiconductor device was made in the same manner as Example 1 except that the thickness of the transparent electrode was 2500 Å and that fluorine of 2 weight % was added to the transparent electrode. V-I characteristic was measured in the same manner as in Example 1. The result is shown in FIG. 2.

From FIG. 2, it is understandable that output of the semiconductor device of the present invention is greatly improved.

Disclosed below is the second embodiment of the present invention.

FIG. 3 is a schematic illustration of the second embodiment of the present invention. In FIG. 3, B shows a semiconductor device of the second embodiment of the present invention. The semiconductor device B comprises a glass substrate 1, a transparent electrode 2 comprising SnO$_2$, amorphous semiconductor layers 3 and a back electrode 4, wherein a high dopant density layer 5 is sandwiched between the transparent electrode 2 and the semiconductor layers 3.

The conductivity of the high dopant density layer 5 is the same as that of the layer of semiconductor layers 3 which contacts thereto. Even if the dopant density in SnO$_2$ layer comprising the transparent electrode 2 is decreased, contact resistance between the transparent electrode 2 and the amorphous semiconductor layers 3 can be lowered by providing the layer 5.

When dopant density of SnO$_2$ is decreased not more than 0.5 weight % and the thickness of transparent electrode 2 is designed to about 10000 Å, the light absorption in the transparent electrode (SnO$_2$) 2 is nearly equal to that of a transparent electrode of which dopant density is 1 weight % and thickness of layer is 5000 Å. In this case, the characteristic of device of which transparent electrode thickness is 10000 Å is improved since the size of the relief of the transparent electrode of 10000 Å thickness is higher than that of 5000 Å thickness.

On the high dopant density layer 5, pin-type or nip-type amorphous semiconductor layers 3 are formed by ordinary methods such as glow discharge decomposition method. FIG. 3 shows a model where a pin-type is formed.

On the amorphous semiconductor layers 3, a back electrode 4 comprising Al, Ag, Mo, Cr, Ni and the like is formed.

EXAMPLE 2

On a glass substrate with 1.1 mm thickness, a transparent electrode of which thickness was 10000 Å comprising SnO$_2$ (0.1 weight % of fluorine was added) was formed by CVD method.

On the transparent electrode a high dopant density layer of which thickness was 50 Å was formed by plasma CVD method with feeding SiH$_4$: 10 SCCM; CH$_4$: 20 SCCM; and B$_2$H$_6$: 300 SCCM.

By plasma CVD method, p-type semiconductor layer of 150 Å thickness with feeding SiH$_4$: 10 SCCM, CH$_4$: 20 SCCM and B$_2$H$_6$: 100 SCCM; i-type layer of 5000 Å thickness with feeding SiH$_4$: 100 SCCM; and n-type layer of 300 Å thickness with feeding SiH$_4$: 10 SCCM and PH$_3$: 200 SCCM were formed in this order on the high dopant density layer.

A back electrode comprising Al of 1 μm thickness on the semiconductor layers was formed on the semiconductor layers by vacuum evaporation method. V-I characteristic of the obtained semiconductor device was measured under AM-1 solar-simulator of 100 mW/cm² light intensity. The result is shown in FIG. 4.

COMPARATIVE EXAMPLE 3

A semiconductor device was made in the same manner as those of Example 2 except that the thickness of transparent electrode was 5000 Å and that dopant density was 1.5 weight % without a high dopant density layer. V-I characteristic was measured in the same manner as those in Example 2. The result is shown in FIG. 4.

COMPARATIVE EXAMPLE 4

A semiconductor device was made in the same manner as those of Example 2 except that a high dopant density layer was not provided. V-I characteristic was measured in the same manner as those in Example 2. The result is shown in FIG. 4.

From FIG. 4, it is understandable that efficiency of the semiconductor device of the present invention is improved.

Below is disclosed the third embodiment of the present invention.

Figure 5:
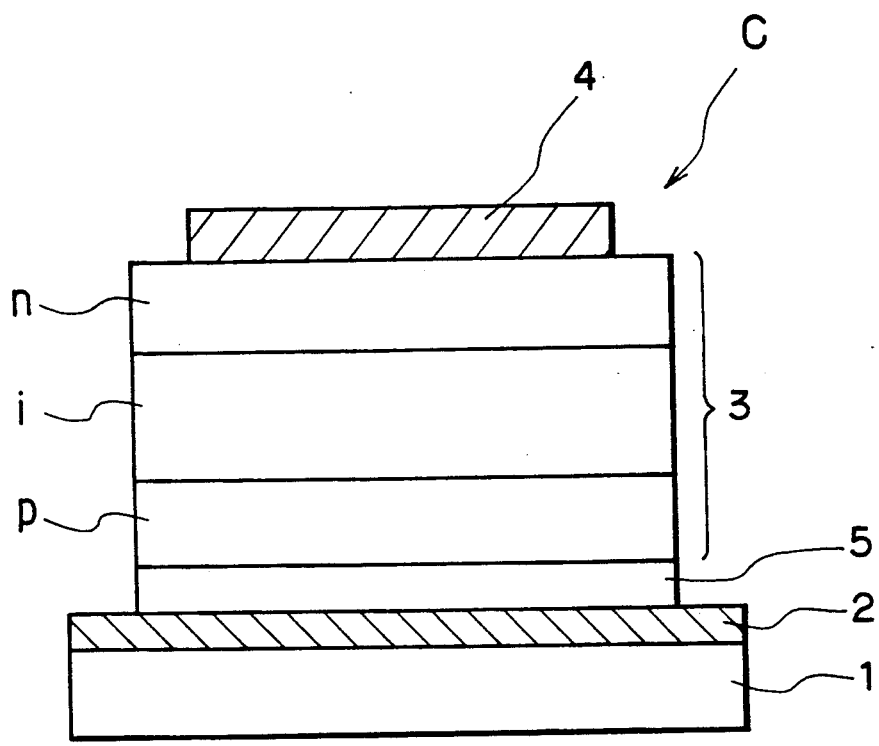

FIG. 5 is a schematic illustration of the third embodiment of the present invention. In FIG. 5, C shows a semiconductor device of the third embodiment. The semiconductor device C comprises a glass substrate 1, a transparent electrode 2 comprising $SnO_2$, semiconductor layers 3 and a back electrode 4, wherein a high dopant density layer 5 is sandwiched between the transparent electrode 2 and the semiconductor layers 3.

Textured surfaces are provided on the surface of the glass substrate 1, for example, by $SiO_2$ coating. There is no limit to the size of relief. In this specification, the size of relief means mean value which is obtained by subtracting troughs from peaks. When the difference is less than 1000 Å, effect of light scattering becomes small. When the difference exceed 10000 Å, short circuit is liable to occur since normal film thickness of solar cell is between 5000 and 10000 Å. Therefore, it is preferable that the difference is between 1000 Å and 10000 Å.

On the transparent electrode 2, high dopant density semiconductor layer 5 is formed like Example 2.

As is stated in Example 2, when dopant density of $SnO_2$ is decreased not more than 0.5 weight % and the thickness of transparent electrode 2 is designed to about 10000 Å, the light absorption in the transparent electrode ($SnO_2$) 2 is nearly equal to that of a transparent electrode of which dopant density is 1 weight % and thickness of layer is 5000 Å. When a transparent electrode of the third aspect of the present invention, no decrease of FF is detected for a substrate with over 40% Haze ratio.

On the high dopant density layer 5, an amorphous semiconductor layer 3 and a back electrode 4 are formed like Example 2. FIG. 5 shows a model where pin-type is formed.

EXAMPLE 3

On a glass substrate with 1.1 mm thickness, of which textured surface (size of relief is about 5000 Å) was formed by coating $SiO_2$, a transparent electrode of which thickness was 10000 Å comprising $SnO_2$ (0.1 weight % of fluorine was added), was formed by CVD method.

On the transparent electrode, a high dopant density layer of which thickness was 50 Å was formed by plasma CVD method with feeding $SiH_4$: 10 SCCM; $CH_4$: 20 SCCM; and $B_2H_6$: 300 SCCM.

By plasma CVD method, p-type semiconductor layer of 150 Å thickness with feeding $SiH_4$: 10 SCCM, $CH_4$: 20 SCCM and $B_2H_6$: 100 SCCM; i-type layer of 5000 Å thickness with feeding $SiH_4$: 100 SCCM; and n-type layer of 300 Å thickness with feeding $SiH_4$: 10 SCCM and $PH_3$: 200 SCCM were formed in this order on the high dopant density layer.

Figure 6:
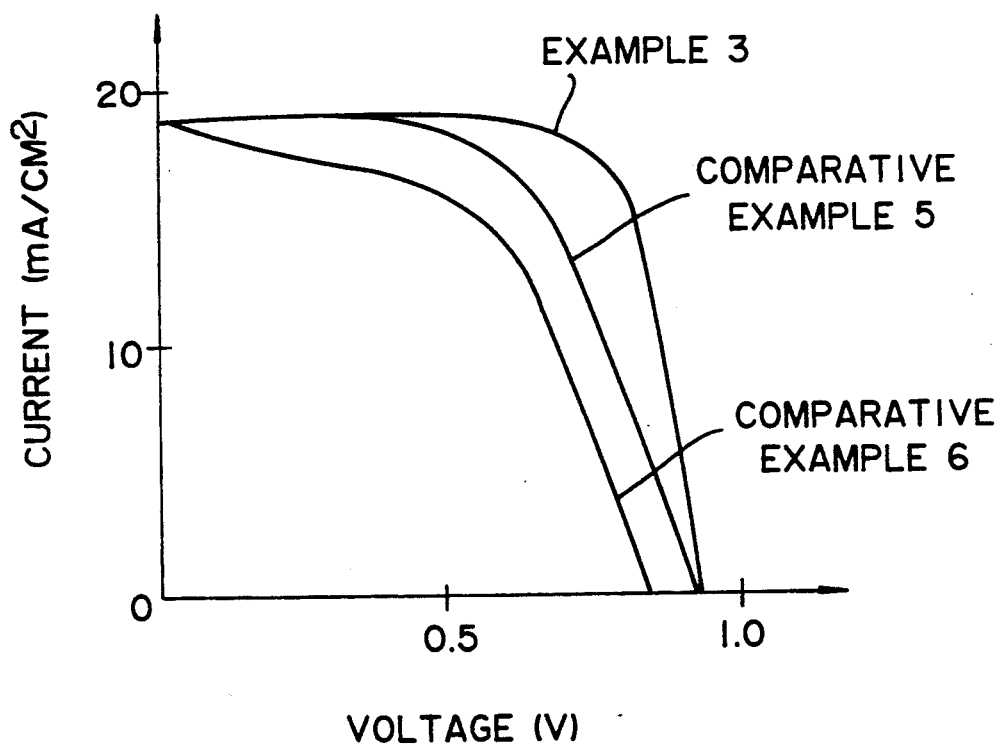
FIG. 6 is a V-I characteristic diagram of example 3 and comparative examples 5 to 6.

A back electrode comprising Al of 1 μm thickness was formed on the semiconductor layers by vacuum evaporation method. V-I characteristic of the obtained semiconductor device was measured under AM-1 solar simulator of 100 mW/cm² light intensity. The result is shown in FIG. 6.

COMPARATIVE EXAMPLE 5

A semiconductor device was made in the same manner as those of Example 3 except that the thickness of transparent electrode was 5000 Å and that dopant density was 1.5 weight % without a high dopant density layer. V-I characteristic was measured in the same manner as those in Example 3. The result is shown in FIG. 6.

COMPARATIVE EXAMPLE 6

A semiconductor device was made in the same manner as Example 3 except that a high dopant density layer was not provided. V-I characteristic was measured in the same manner as in Example 3. The result is shown in FIG. 6.

From FIG. 6, it is understandable that efficiency of the semiconductor device of the present invention is improved.

According to the present invention, characteristics of solar cell can be improved.

It is further understood by those skilled in the art that the foregoing description are preferred embodiments of the disclosed device and that various changes and modifications may be made in the invention without departing from the spirit and scope thereof.

What we claim is:

1. A semiconductor device comprising a glass substrate having formed thereon, in order,
   (a) a transparent electrode comprising a $SnO_2$;
   (b) amorphous semiconductor layers having at least one pin-junction or nip-junction; and
   (c) a back electrode,
   wherein the transparent electrode has a dopant density of not more than 0.5 weight %.

2. The semiconductor device of claim 1, wherein an amorphous semiconductor layer having an electric conductivity equal to and a dopant density higher than that of the semiconductor layer of said amorphous semiconductor layers which faces said transparent electrode is sandwiched between the transparent electrode and the semiconductor layers.

3. The semiconductor device of claim 1 or 2, wherein the semiconductor layer which faces the transparent electrode comprises a-SiC: H.

4. The semiconductor device of claim 1 or 2, wherein the transparent electrode is doped with a member selected from the group consisting of Al, Sb and F.

5. The semiconductor device of claim 1 or 2, wherein the glass substrate has a textured surface and the size of the relief is between 1,000 Å and 10,000 Å.

6. The semiconductor device of claim 1 or 2, wherein the transparent electrode has a thickness between 5,000 Å and 20,000 Å.

7. The semiconductor device of claim 1 or 2, wherein the transparent electrode has a sheet resistance of between 10 Ω/□ and 40 Ω/□.

* * * * *

UNITED STATES PATENT AND TRADEMARK OFFICE
CERTIFICATE OF CORRECTION

PATENT NO. : 5,091,764

DATED : February 25, 1992

INVENTOR(S) : Keizo Asaoka, et al

It is certified that error appears in the above-identified patent and that said Letters Patent is hereby corrected as shown below:

Title page, item [21], "143,797" should read --413,797--.

Signed and Sealed this

Eleventh Day of May, 1993

Attest:

MICHAEL K. KIRK

Attesting Officer     Acting Commissioner of Patents and Trademarks